(12) United States Patent
Dai et al.

(10) Patent No.: US 8,101,978 B2
(45) Date of Patent: Jan. 24, 2012

(54) CIRCUIT AND PHOTO SENSOR OVERLAP FOR BACKSIDE ILLUMINATION IMAGE SENSOR

(75) Inventors: Tiejun Dai, Santa Clara, CA (US); Hsin-Chih Tai, Cupertino, CA (US); Sohei Manabe, San Jose, CA (US); Hidetoshi Nozaki, Sunnyvale, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 586 days.

(21) Appl. No.: 12/053,476

(22) Filed: Mar. 21, 2008

(65) Prior Publication Data

US 2009/0200624 A1    Aug. 13, 2009

Related U.S. Application Data

(60) Provisional application No. 61/027,356, filed on Feb. 8, 2008.

(51) Int. Cl.
  *H01L 27/148* (2006.01)
  *H01L 29/768* (2006.01)
  *H01L 31/062* (2006.01)
  *H01L 31/113* (2006.01)
(52) U.S. Cl. .. 257/228; 257/292; 257/293; 257/E27.133
(58) Field of Classification Search ............... 257/228, 257/291–293, E27.133
See application file for complete search history.

(56) References Cited

U.S. PATENT DOCUMENTS

| | | | |
|---|---|---|---|
| 4,760,031 A | 7/1988 | Janesick | |
| 5,688,715 A | 11/1997 | Sexton et al. | |
| 6,169,319 B1 | 1/2001 | Malinovich et al. | |
| 6,369,737 B1 * | 4/2002 | Yang et al. | 341/155 |
| 6,433,373 B1 * | 8/2002 | Lee et al. | 257/292 |
| 6,489,992 B2 | 12/2002 | Savoye | |
| 6,960,796 B2 | 11/2005 | Rhodes et al. | |
| 7,005,637 B2 | 2/2006 | Costello et al. | |
| 7,417,273 B2 * | 8/2008 | Inoue et al. | 257/292 |
| 2003/0058356 A1 * | 3/2003 | DiCarlo et al. | 348/241 |
| 2005/0030399 A1 * | 2/2005 | Suzuki et al. | 348/294 |
| 2006/0076590 A1 | 4/2006 | Pain et al. | |
| 2007/0091190 A1 | 4/2007 | Iwabuchi et al. | |
| 2007/0246756 A1 * | 10/2007 | Mouli | 257/292 |

(Continued)

FOREIGN PATENT DOCUMENTS

EP    1858082    11/2007
KR    20070047061    5/2007

OTHER PUBLICATIONS

PCT/US2009/032898, PCT International Search Report and Written Opinion of the International Searching Authority, mailed Jul. 15, 2009, 10 pages.

(Continued)

*Primary Examiner* — Shouxiang Hu
(74) *Attorney, Agent, or Firm* — Blakely Sokoloff Taylor & Zafman LLP

(57) ABSTRACT

A backside illuminated ("BSI") imaging sensor pixel includes a photodiode region and pixel circuitry. The photodiode region is disposed within a semiconductor die for accumulating an image charge in response to light incident upon a backside of the BSI imaging sensor pixel. The pixel circuitry includes transistor pixel circuitry disposed within the semiconductor die between a frontside of the semiconductor die and the photodiode region. At least a portion of the pixel circuitry overlaps the photodiode region.

9 Claims, 6 Drawing Sheets

U.S. PATENT DOCUMENTS

2007/0259463 A1   11/2007   Abedini
2008/0001192 A1   1/2008    Inoue et al.

OTHER PUBLICATIONS

Janesick, J. "Charge coupled CMOS and hybrid detector arrays," SPIE, San Diego, Focal Plane Arrays for Space Telescope, paper #5167-1, Aug. 2003.

First Korean Office Action issued Aug. 13, 2011, Korean Application 10-2010-7017059 filed Feb. 2, 2009, 4 pages.

European Patent Application No. EP 09708988.2-2203, European Examination Report mailed Mar. 23, 2011, 4 pages.

* cited by examiner

US 8,101,978 B2

CIRCUIT AND PHOTO SENSOR OVERLAP FOR BACKSIDE ILLUMINATION IMAGE SENSOR

CROSS REFERENCE TO RELATED APPLICATION

This application claims the benefit of U.S. Provisional Application No. 61/027,356, filed on Feb. 8, 2008, the contents of which are incorporated herein by reference.

TECHNICAL FIELD

This disclosure relates generally to image sensors, and in particular but not exclusively, relates to backside illumination CMOS image sensors.

BACKGROUND INFORMATION

FIG. 1 illustrates a conventional frontside illuminated complementary metal-oxide-semiconductor ("CMOS") imaging pixel 100. The frontside of imaging pixel 100 is the side of substrate 105 upon which the pixel circuitry is disposed and over which metal stack 110 for redistributing signals is formed. The metal layers (e.g., metal layer M1 and M2) are patterned in such a manner as to create an optical passage through which light incident on the frontside of imaging pixel 100 can reach the photosensitive or photodiode ("PD") region 115. The frontside may further include a color filter layer to implement a color sensor and a microlens to focus the light onto PD region 115.

Imaging pixel 100 includes pixel circuitry disposed within pixel circuitry region 125 adjacent to PD region 115. This pixel circuitry provides a variety of functionality for regular operation of imaging pixel 100. For example, pixel circuitry region 125 may include circuitry to commence acquisition of an image charge within PD region 115, to reset the image charge accumulated within PD region 115 to ready imaging pixel 100 for the next image, or to transfer out the image data acquired by imaging pixel 100. As illustrated, in a frontside illuminated configuration, pixel circuitry region 125 is positioned immediately adjacent to PD region 115. Consequently, pixel circuitry region 125 consumes valuable real estate within imaging pixel 100 at the expense of PD region 115. Reducing the size of PD region 115 to accommodate the pixel circuitry reduces the fill factor of imaging pixel 100 thereby reducing the amount of pixel area that is sensitive to light, and reducing low light performance.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method for operation of a backside illuminated image sensor with overlapping pixel circuitry are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. The term "overlapping" is defined herein with reference to the surface normal of a semiconductor die. Two elements disposed on a die are said to be "overlapping" if a line drawn through a cross section of the semiconductor die running parallel with the surface normal intersects the two elements.

Figure 2:
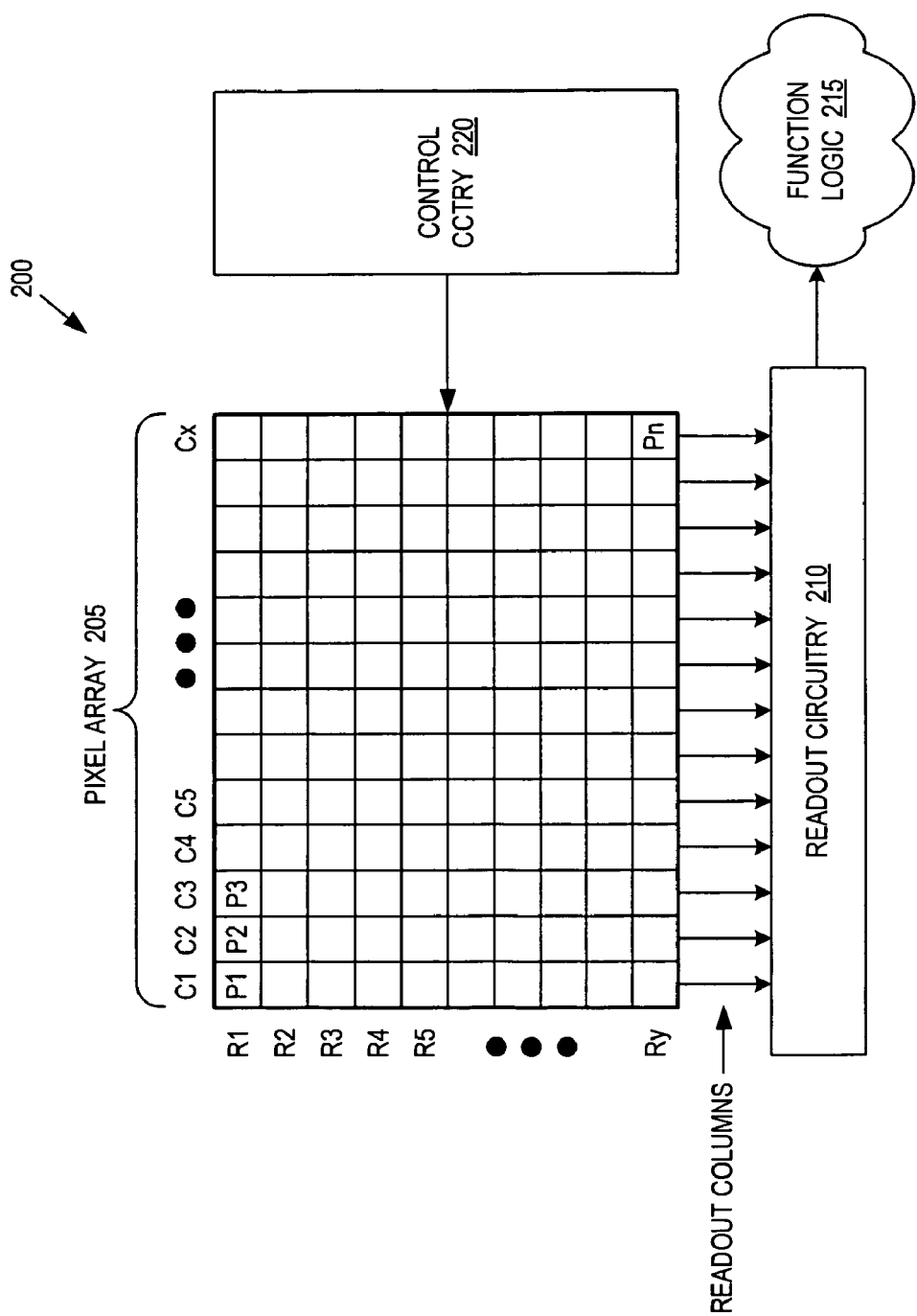
FIG. 2 is a block diagram illustrating a backside illuminated imaging system, in accordance with an embodiment of the invention.

FIG. 2 is a block diagram illustrating a backside illuminated imaging system 200, in accordance with an embodiment of the invention. The illustrated embodiment of imaging system 200 includes a pixel array 205, readout circuitry 210, function logic 215, and control circuitry 220.

Pixel array 205 is a two-dimensional ("2D") array of backside illuminated imaging sensors or pixels (e.g., pixels P1, P2 . . . , Pn). In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 210 and transferred to function logic 215. Readout circuitry 210 may include amplification circuitry, analog-to-digital ("ADC") conversion circuitry, or otherwise. Function logic 215 may simply store the image data or even manipulate the image data by applying post image effects (e.g., crop, rotate, remove red eye, adjust brightness, adjust contrast, or otherwise). In one embodiment, readout circuitry 210 may readout a row of image data at a time along readout column lines (illustrated) or may readout the image data using a variety of other techniques (not illustrated), such as a serial readout or a full parallel readout of all pixels simultaneously.

Control circuitry 220 is coupled to pixel array 205 to control operational characteristic of pixel array 205. For example, control circuitry 220 may generate a shutter signal for controlling image acquisition. In one embodiment, the shutter signal is a global shutter signal for simultaneously enabling all pixels within pixel array 205 to simultaneously capture their respective image data during a single acquisition window. In an alternative embodiment, the shutter signal is a rolling shutter signal whereby each row, column, or group of pixels is sequentially enabled during consecutive acquisition windows.

Figure 3A:
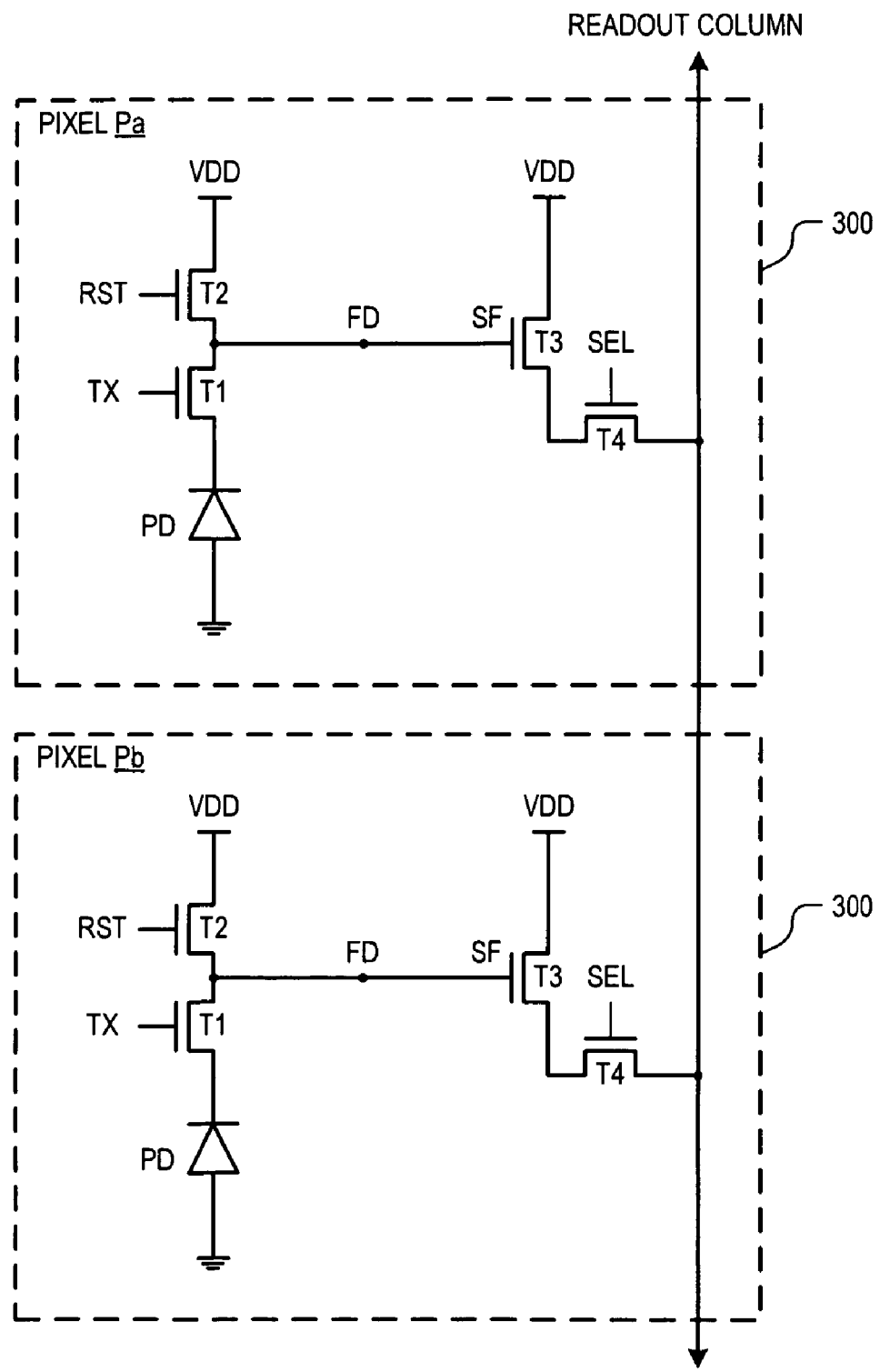
FIG. 3A is a circuit diagram illustrating pixel circuitry of two 4T pixels within a backside illuminated imaging system, in accordance with an embodiment of the invention.

FIG. 3A is a circuit diagram illustrating pixel circuitry 300 of two four-transistor ("4T") pixels within a backside illuminated imaging array, in accordance with an embodiment of the invention. Pixel circuitry 300 is one possible pixel circuitry architecture for implementing each pixel within pixel array 200 of FIG. 2. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 3A, pixels Pa and Pb are arranged in two rows and one column. The illustrated embodiment of each pixel circuitry 300 includes a photodiode PD, a transfer transistor T1, a reset transistor T2, a source-follower ("SF") transistor T3, a select transistor T4, and a storage capacitor C1. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges.

Reset transistor T2 is coupled between a power rail VDD and the floating diffusion node FD to reset the pixel (e.g., discharge or charge the FD and the PD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance connection to the floating diffusion FD. Finally, select transistor T4 selectively couples the output of pixel circuitry 300 to the readout column line under control of a select signal SEL.

In one embodiment, the TX signal, the RST signal, and the SEL signal are generated by control circuitry 220. In an embodiment where pixel array 205 operates with a global shutter, the global shutter signal is coupled to the gate of each transfer transistor T1 in the entire pixel array 205 to simultaneously commence charge transfer from each pixel's photodiode PD. Alternatively, rolling shutter signals may be applied to groups of transfer transistors T1.

Figure 3B:
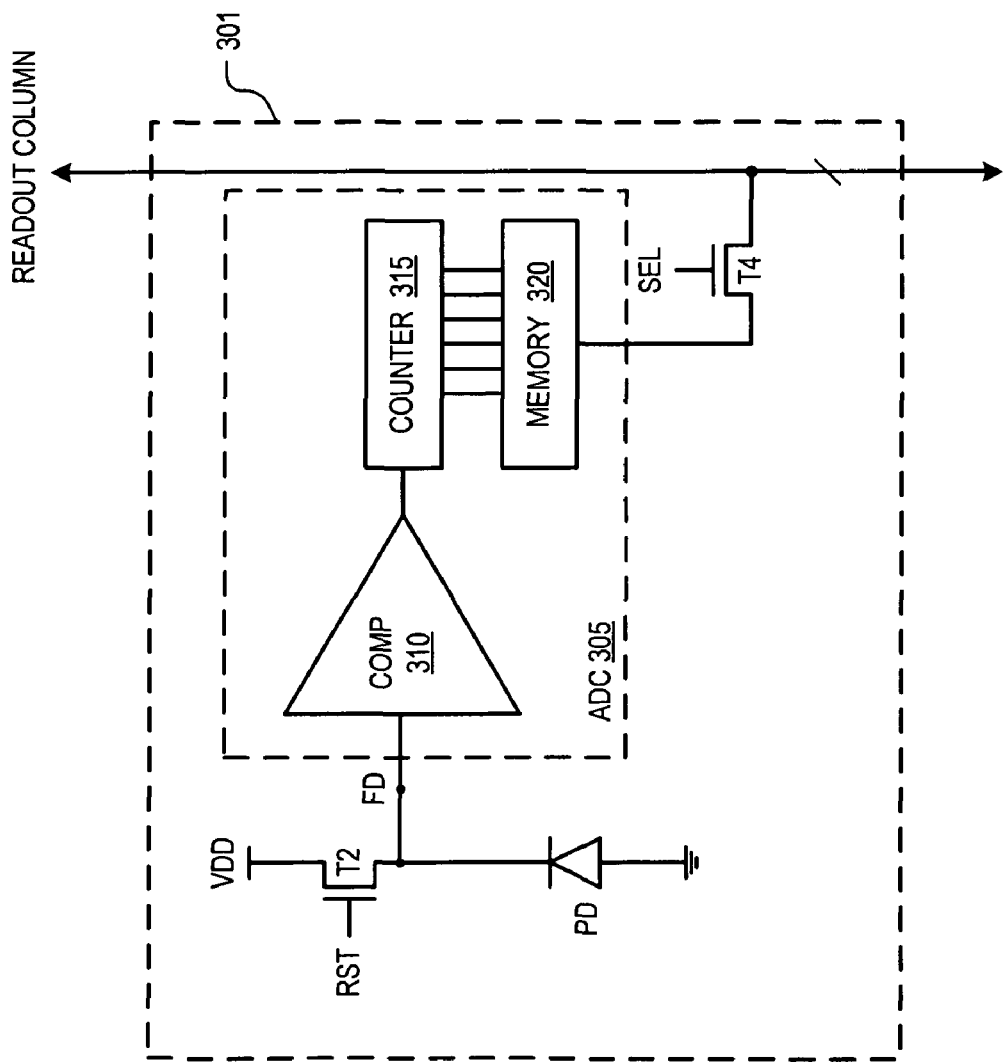
FIG. 3B is a circuit diagram illustrating pixel circuitry of an active pixel sensor including analog-to-digital conversion circuitry within a backside illuminated imaging system, in accordance with an embodiment of the invention.

FIG. 3B is a circuit diagram illustrating pixel circuitry 301 using an active pixel sensor ("APS") architecture including an integrated analog-to-digital converter ("ADC") 305, in accordance with an embodiment of the invention. Pixel circuitry 301 is another possible pixel circuitry architecture for implementing each pixel within pixel array 200 of FIG. 2. The APS architecture illustrated includes only two transistors (reset transistor T2 and select transistor T4); however, if the ADC 305 were not integrated into pixel circuitry 301, then SF transistor T3 would be included and pixel circuitry 301 would be referred to as a 3T pixel design. It should be appreciated that FIG. 3B is just one possible implementation of integrating an ADC into a pixel and that other implementations may be used with embodiments of the invention. For example, an ADC may be incorporated into the 4T design illustrated in FIG. 3A.

The illustrated embodiment of pixel circuitry 301 includes a PD, a reset transistor T2, a select transistor T4, and ADC 305. The illustrated embodiment of ADC 305 includes a comparator ("COMP") 310, a counter 315, and memory 320. During operation, ADC 305 may operate to convert the analog image charge accumulated by the PD into image data having a digital value representation prior to output on the column bus by select transistor T4. Memory 320 is a multi-bit register (e.g., 8 bit, 16 bit, 20 bit, etc.) for temporarily storing the digital image data. In one embodiment, the pixel circuitry of each pixel P1 to Pn within pixel array 205 includes its own ADC 305. In one embodiment, two or more adjacent pixels may share one or more components of ADC 305. In a sharing embodiment, the circuitry of a shared ADC 305 may overlap two or more adjacent pixels.

Figure 4:
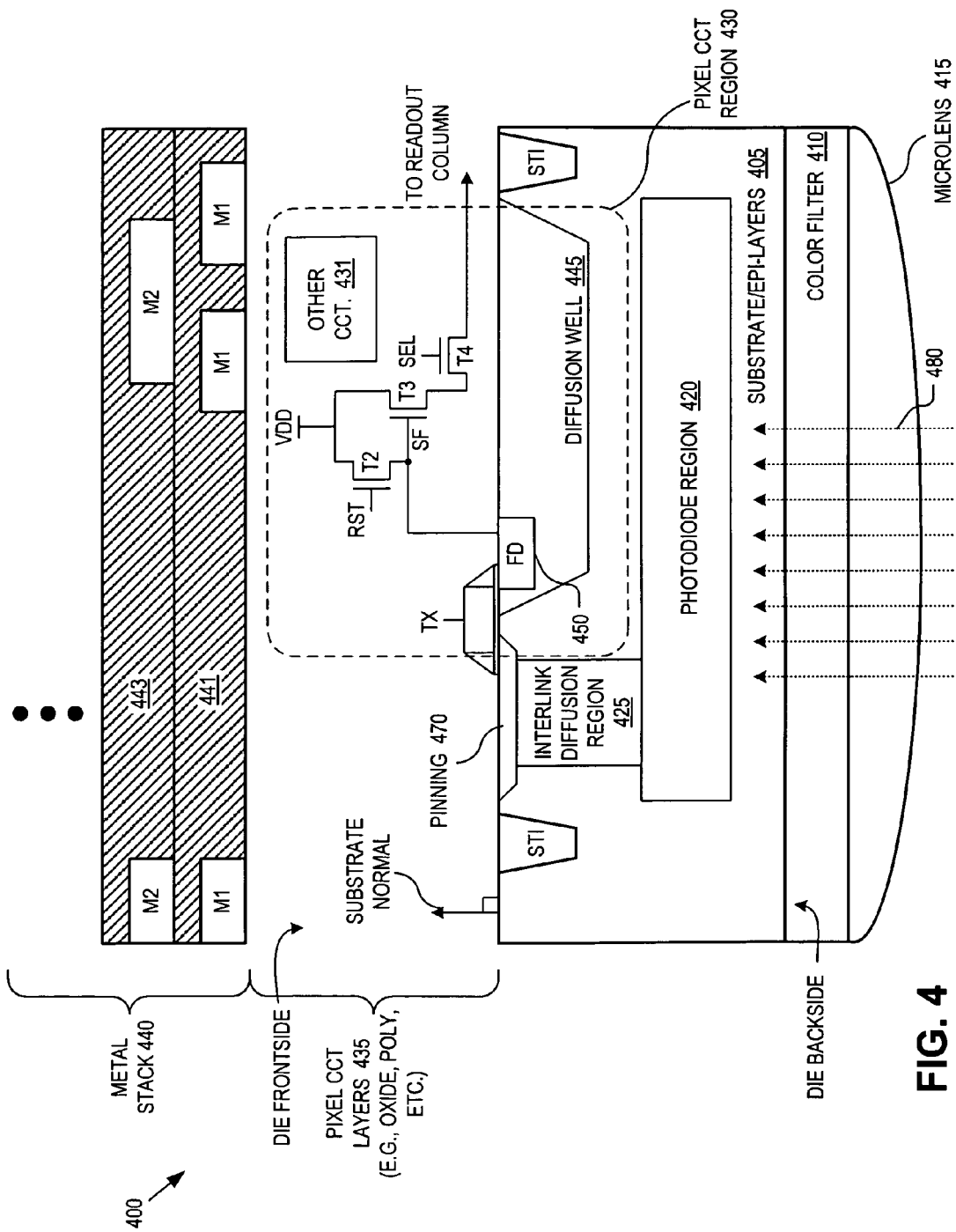
FIG. 4 is a hybrid cross sectional/circuit illustration of a backside illuminated imaging pixel with overlapping pixel circuitry, in accordance with an embodiment of the invention.

FIG. 4 is a hybrid cross sectional/circuit illustration of a backside illuminated imaging pixel 400 with overlapping pixel circuitry, in accordance with an embodiment of the invention. Imaging pixel 400 is one possible implementation of pixels P1 to Pn within pixel array 205. The illustrated embodiment of imaging pixel 400 includes a substrate 405, a color filter 410, a microlens 415, a PD region 420, an interlinking diffusion region 425, a pixel circuitry region 430, pixel circuitry layers 435, and a metal stack 440. The illustrated embodiment of pixel circuitry region 430 includes a 4T pixel (other pixel designs may be substituted), as well as other circuitry 431 (e.g., gain circuitry, ADC circuitry, gamma control circuitry, exposure control circuitry, etc.), disposed over a diffusion well 445. A floating diffusion 450 is disposed within diffusion well 445 and coupled between transfer transistor T1 and the gate of SF transistor T3. The illustrated embodiment of metal stack 440 includes two metal layers M1 and M2 separated by intermetal dielectric layers 441 and 443. Although FIG. 4 illustrates only a two layer metal stack, metal stack 440 may include more or less layers for routing signals over the frontside of pixel array 205. In one embodiment, a passivation or pinning layer 470 is disposed over interlinking diffusion region 425. Finally, shallow trench isolations ("STI") isolate imaging pixel 400 from adjacent pixels (not illustrated).

Figure 1:
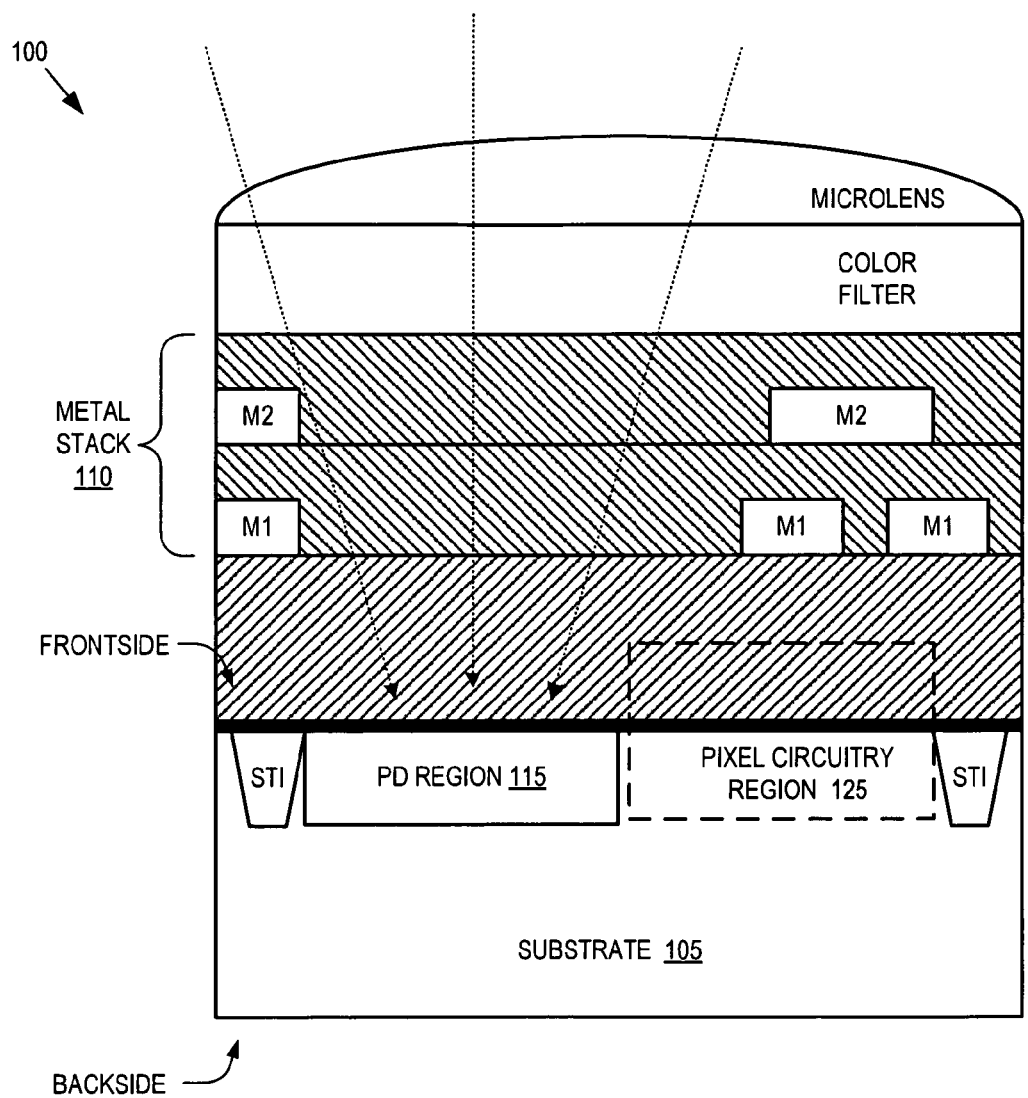
FIG. 1 is a cross sectional view of a conventional frontside illuminated imaging pixel.

As illustrated, imaging pixel 400 is photosensitive to light 480 incident on the backside of its semiconductor die. By using a backside illuminated sensor, pixel circuitry region 430 can be positioned in an overlapping configuration with photodiode region 420. In other words, pixel circuitry 300 can be placed adjacent to interlinking diffusion region 425 and between photodiode region 420 and the die frontside without obstructing light 480 from reaching photodiode region 420. By placing the pixel circuitry in an overlapping configuration with photodiode region 420, as opposed to side-by-side configuration as illustrated in FIG. 1, photodiode region 420 no longer competes for valuable die real estate with the pixel circuitry. Rather, pixel circuitry region 430 can be enlarged to accommodate additional or larger components without detracting from the fill factor of the image sensor. Embodiments of the present invention enable other circuits 431, such as gain control or ADC circuitry (e.g., ADC 305), to be placed in close proximity to their respective photodiode region 420 without decreasing the sensitivity of the pixel. By inserting gain control and ADC circuitry in close proximity to each PD region 420, circuit noise can be reduced and noise immunity improved due to shorter electrical interconnections between PD region 420 and the additional in-pixel circuitry. Furthermore, the backside illumination configuration provides greater flexibility to route signals over the frontside of pixel array 205 within metal stack 440 without interfering with light 480. In one embodiment, the shutter signal is routed within metal stack 440 to the pixels within pixel array 205.

In one embodiment, pixel circuit regions 430 over PD regions 420 of adjacent pixels within pixel array 205 can be grouped to create communal die real estate. This communal die real estate can support shared circuitry (or inter-pixel circuitry) in addition to the basic 3T, 4T, 5T, etc. pixel circuitry. Alternatively, some pixels can donate their unused die real estate above their PD regions 420 to an adjacent pixel requiring additional pixel circuitry space for larger or more advanced in-pixel circuitry. Accordingly, in some embodiments, other circuitry 431 may overlap two or more PD regions 420 and may even be shared by one or more pixels.

In one embodiment, substrate 405 is doped with P type dopants. In this case, substrate 405 and the epitaxial layers grown thereon may be referred to as a P substrate. In a P type substrate embodiment, diffusion well 445 is a P+ well implant while photodiode region 420, interlinking diffusion region 425, and floating diffusion 450 are N type doped. Floating diffusion 450 is doped with an opposite conductivity type dopant as diffusion well 445 to generate a p-n junction within diffusion well 445, thereby electrically isolating floating diffusion 450. In an embodiment where substrate 405 and the epitaxial layers thereon are N type, diffusion well 445 is also N type doped, while photodiode region 420, interlinking diffusion region 425, and floating diffusion 450 have an opposite P type conductivity.

Figure 5:
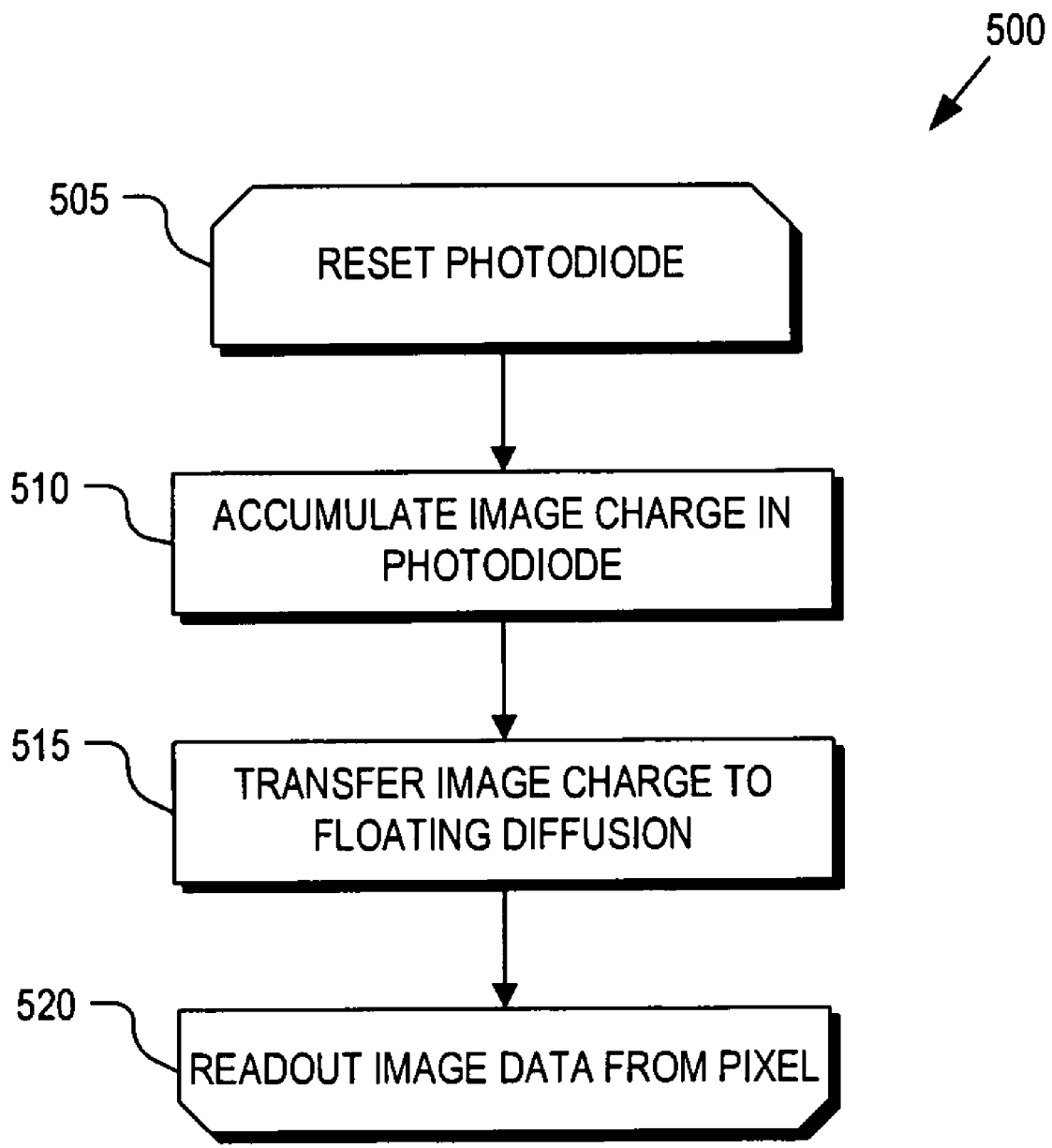
FIG. 5 is a flow chart illustrating a process for operating a backside illuminated imaging pixel with overlapping pixel circuitry, in accordance with an embodiment of the invention.

FIG. 5 is a flow chart illustrating a process 500 for operating BSI imaging pixel 400, in accordance with an embodiment of the invention. Process 500 illustrates the operation of a single pixel within pixel array 205; however, it should be appreciated that process 500 may be sequentially or concurrently executed by each pixel in pixel array 205 depending upon whether a rolling shutter or global shutter is used. The order in which some or all of the process blocks appear in process 500 should not be deemed limiting. Rather, one of ordinary skill in the art having the benefit of the present disclosure will understand that some of the process blocks may be executed in a variety of orders not illustrated.

In a process block 505, photodiode PD (e.g., photodiode region 420) is reset. Resetting includes discharging or charging photodiode PD to a predetermined voltage potential, such as VDD. The reset is achieved by asserting both the RST signal to enable reset transistor T2 and asserting the TX signal to enable transfer transistor T1. Enabling T1 and T2 couples photodiode region 420, interlinking diffusion region 425, and floating diffusion 450 to power rail VDD.

Once reset, the RST signal and the TX signal are de-asserted to commence image acquisition by photodiode region 420 (process block 510). Light 480 incident on the backside of imaging pixel 400 is focused by microlens 415 through color filter 410 onto the backside of photodiode region 420. Color filter 410 operates to filter the incident light 480 into component colors (e.g., using a Bayer filter mosaic or color filter array). The incident photons cause charge to accumulate within the diffusion region of the photodiode.

Once the image acquisition window has expired, the accumulated charge within photodiode region 420 is transferred via the transfer transistor T1 to the floating diffusion 450 by asserting the TX signal (process block 515). In the case of a global shutter, the global shutter signal is asserted simultaneously, as the TX signal, to all pixels within pixel array 205 during process block 515. This results in a global transfer of the image data accumulated by each pixel into the pixel's corresponding floating diffusion 450.

Once the image data is transferred, the TX signal is de-asserted to isolate floating diffusion 450 from PD region 420 for readout. In a process block 520, the SEL signal is asserted to transfer the stored image data onto the readout column for output to the function logic 215 via readout circuitry 210. It should be appreciated that readout may occur on a per row basis via column lines (illustrated), on a per column basis via row lines (not illustrated), on a per pixel basis (not illustrated), or by other logical groupings. Once the image data of all pixels has been readout, process 500 returns to process block 505 to prepare for the next image.

In one embodiment, other circuitry 431 may include a storage capacitor coupled to FD 450 to temporarily store the image charge so that post image acquisition processing may be executed within each pixel prior to readout in process block 520. Such circuitry may include gain circuitry, ADC circuitry, or otherwise. Other circuitry 431 may even include exposure control circuitry and gamma control circuitry. The overlapping BSI configuration provides room within each pixel to enable such intra-pixel processing without sacrificing the fill factor of pixel 400.

The processes explained above are described in terms of computer software and hardware. The techniques described may constitute machine-executable instructions embodied within a machine (e.g., computer) readable storage medium, that when executed by a machine will cause the machine to perform the operations described. Additionally, the processes may be embodied within hardware, such as an application specific integrated circuit ("ASIC") or the like.

A machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A backside illuminated ("BSI") imaging sensor, comprising:
a first photodiode region of a first pixel disposed within a semiconductor die for accumulating an image charge in response to light incident upon a backside of the BSI imaging sensor;
pixel circuitry of the first pixel including transistor pixel circuitry disposed within the semiconductor die between a frontside of the semiconductor die and the first photodiode region, wherein at least a portion of the pixel circuitry overlaps the first photodiode region; and
a second pixel adjacent to the first pixel including a second photodiode region, wherein the second pixel includes die real estate above the second photodiode that is unused by the second pixel,
wherein a portion of the pixel circuitry of the first pixel extends over the die real estate above the second photodiode that is unused by the second pixel such that the second pixel donates unused die real estate to the first pixel to accommodate larger pixel circuitry than would fit within the first pixel.

2. The BSI imaging sensor of claim 1, wherein the pixel circuitry comprises an analog-to-digital converter ("ADC") coupled to convert the image charge to a digital value, wherein at least a portion of the ADC overlaps the first and second photodiode regions of both the first and second pixels.

3. The BSI imaging sensor of claim 1, wherein the pixel circuitry comprises gain circuitry for amplifying image data derived from the image charge, wherein at least a portion of the gain circuitry overlaps the first and second photodiode regions of both the first and second pixels.

4. The BSI imaging sensor of claim 1, wherein the pixel circuitry comprises at least one of gamma control circuitry or exposure control circuitry, wherein at least a portion of the gamma control circuitry or the exposure control circuitry overlaps the first and second photodiode regions of both the first and second pixels.

5. The BSI imaging sensor of claim 1, wherein the pixel circuitry includes additional circuitry in addition to three transistor ("3T"), four transistor ("4T"), or five transistor ("5T") pixel circuitry, wherein at least a portion of the additional circuitry overlaps the first and second photodiode regions of both the first and second pixels.

6. The BSI imaging sensor of claim 1, wherein the BSI imaging sensor comprises a BSI complimentary metal-oxide-semiconductor ("CMOS") imaging sensor.

7. The BSI imaging sensor of claim 6, further comprising an interlinking diffusion region disposed within the semiconductor die, the interlinking diffusion region coupled between the first photodiode region and the pixel circuitry, the interlinking diffusion region positioned adjacent to the pixel circuitry and extending towards the frontside of the semiconductor die.

8. The imaging sensor of claim 6, wherein the pixel circuitry comprises:
a transfer transistor coupled between the first photodiode region and a floating diffusion;
a reset transistor coupled to reset charge accumulated in the first photodiode region;
a source-follower transistor coupled to provide a high impedance output from the floating diffusion; and
a select transistor to select the BSI imaging sensor pixel from other imaging sensor pixels for readout.

9. The BSI imaging sensor of claim 1, further comprising:
a microlens disposed on a backside of the semiconductor die below the first photodiode region and optically aligned to focus light received from the backside onto the first photodiode region; and
a color filter disposed between the microlens and the first photodiode region to filter the light.

* * * * *